(12) United States Patent
Tagawa et al.

(10) Patent No.: US 8,550,837 B2
(45) Date of Patent: Oct. 8, 2013

(54) ELECTRICAL CONNECTOR AND ELECTRICAL CONNECTOR ASSEMBLY

(75) Inventors: Tetsuya Tagawa, Machida (JP); Takeshi Hirakawa, Machida (JP)

(73) Assignee: Dai-Ichi Seiko Co., Ltd., Kyoto (JP)

( * ) Notice: Subject to any disclaimer, the term of this patent is extended or adjusted under 35 U.S.C. 154(b) by 108 days.

(21) Appl. No.: 13/348,916

(22) Filed: Jan. 12, 2012

(65) Prior Publication Data
US 2012/0225575 A1    Sep. 6, 2012

(30) Foreign Application Priority Data
Mar. 2, 2011    (JP) ................. 2011-044858

(51) Int. Cl.
*H01R 4/50*    (2006.01)

(52) U.S. Cl.
USPC ....................................... 439/345

(58) Field of Classification Search
USPC ............... 439/345, 660, 495, 76.1, 76.2
See application file for complete search history.

(56) References Cited

U.S. PATENT DOCUMENTS

| | | | | |
|---|---|---|---|---|
| 3,760,130 | A * | 9/1973 | Ross et al. | 200/43.02 |
| 4,169,650 | A * | 10/1979 | Schweizer | 439/581 |
| 4,236,779 | A * | 12/1980 | Tang | 439/607.48 |
| 4,272,148 | A * | 6/1981 | Knack, Jr. | 439/455 |
| 4,337,989 | A * | 7/1982 | Asick et al. | 439/607.23 |
| 4,415,223 | A * | 11/1983 | Asick | 439/607.48 |
| 4,453,798 | A * | 6/1984 | Asick et al. | 439/581 |
| 4,508,414 | A * | 4/1985 | Kusui et al. | 439/607.47 |
| 4,602,830 | A * | 7/1986 | Lockard | 439/108 |
| 4,602,831 | A * | 7/1986 | Lockard | 439/108 |
| 4,886,464 | A * | 12/1989 | Zetena, Jr. | 439/98 |
| 5,123,853 | A * | 6/1992 | Gilbert et al. | 439/98 |
| 5,466,175 | A * | 11/1995 | Onoda | 439/607.48 |
| 5,581,130 | A * | 12/1996 | Boucheron | 307/10.1 |
| 5,973,409 | A * | 10/1999 | Neibecker et al. | 307/10.1 |
| 6,007,370 | A * | 12/1999 | Langridge | 439/455 |
| 6,022,247 | A * | 2/2000 | Akiyama et al. | 439/701 |
| 6,062,903 | A * | 5/2000 | Hawes et al. | 439/507 |
| 6,074,251 | A * | 6/2000 | Edgerly et al. | 439/607.41 |
| 6,099,327 | A * | 8/2000 | Chen | 439/95 |
| 6,152,746 | A * | 11/2000 | Brown | 439/99 |
| 6,186,828 | B1 * | 2/2001 | O'Sullivan | 439/579 |
| 6,464,538 | B2 * | 10/2002 | Miyazaki et al. | 439/607.44 |
| 6,469,259 | B2 * | 10/2002 | Takeshita et al. | 174/261 |
| 6,506,060 | B2 * | 1/2003 | Sumida et al. | 439/76.2 |

(Continued)

FOREIGN PATENT DOCUMENTS

| | | |
|---|---|---|
| JP | 2001-43939 | 2/2001 |
| JP | 2002-324636 | 11/2002 |
| JP | 2006-216445 | 8/2006 |

OTHER PUBLICATIONS

U.S. Appl. No. 13/286,619, filed Nov. 1, 2011, Ikari, et al.

*Primary Examiner* — Amy Cohen Johnson
*Assistant Examiner* — Vladimir Imas
(74) *Attorney, Agent, or Firm* — Oblon, Spivak, McClelland, Maier & Neustadt, L.L.P.

(57) ABSTRACT

A configuration in which a stand-alone plug connector is directly fitted to the wall of a product case, and in the fitting state of the stand-alone plug connector, the contact part of a contact comes in contact with the contact part of a wiring pattern conductive path exposed on the surface of a fit connecting hole, and the electrical connection of a signal transmitting medium can be performed in a simple configuration.

10 Claims, 17 Drawing Sheets

(56) References Cited

U.S. PATENT DOCUMENTS

| | | | |
|---|---|---|---|
| 6,514,091 B2* | 2/2003 | Saito et al. | 439/76.2 |
| 6,608,399 B2* | 8/2003 | McConnell et al. | 307/10.1 |
| 6,634,910 B2* | 10/2003 | Lieb et al. | 439/715 |
| 6,967,849 B1* | 11/2005 | Hwang et al. | 361/760 |
| 6,973,588 B2* | 12/2005 | DeMeo et al. | 714/6.1 |
| 6,987,656 B2* | 1/2006 | Nakamura et al. | 361/104 |
| 7,052,292 B2* | 5/2006 | Hsu et al. | 439/98 |
| 7,134,907 B2* | 11/2006 | Watanabe et al. | 439/495 |
| 7,212,386 B1* | 5/2007 | Finlay et al. | 361/42 |
| 7,355,887 B2* | 4/2008 | Nakamura et al. | 365/185.02 |
| 7,375,981 B2* | 5/2008 | Dickson | 361/803 |
| 7,479,020 B2* | 1/2009 | Whitton | 439/101 |
| 7,507,120 B1* | 3/2009 | Bright et al. | 439/607.41 |
| 7,525,221 B2* | 4/2009 | Deptula et al. | 307/112 |
| 7,587,001 B2* | 9/2009 | Hazani et al. | 375/316 |
| 7,651,334 B2* | 1/2010 | Zhang | 439/63 |
| 8,021,187 B2 | 9/2011 | Tagawa et al. | |
| 8,241,065 B2* | 8/2012 | Ikari et al. | 439/607.41 |
| 8,403,685 B2* | 3/2013 | Halmuschi et al. | 439/98 |
| 8,414,306 B2* | 4/2013 | Tagawa et al. | 439/63 |
| 2001/0030047 A1* | 10/2001 | Chau et al. | 166/378 |
| 2009/0029601 A1* | 1/2009 | Yamaji | 439/694 |
| 2011/0133932 A1* | 6/2011 | Tan et al. | 340/568.1 |
| 2013/0012066 A1* | 1/2013 | Hirakawa | 439/620.01 |
| 2013/0040505 A1* | 2/2013 | Hirakawa | 439/733.1 |

* cited by examiner

ELECTRICAL CONNECTOR AND ELECTRICAL CONNECTOR ASSEMBLY

BACKGROUND OF THE INVENTION

1. Field of the Invention

The present invention relates to an electrical connector and an electrical connector assembly which are for electrically connecting a terminal portion of a signal transmitting medium to a conductive path formed on a surface of a product case.

2. Description of the Related Art

In general, in various types of electronic devices or electric devices such as a mobile telephone, connecting a terminal portion of various types of signal transmitting media comprising a thin coaxial cable, a flexible wiring substrate, a printed wiring substrate or the like to a printed wiring substrate side with the use of an electrical connector has been widely practiced (for example, see Japanese Unexamined Patent Application Publication No. 2001-43939). The electrical connector is for connecting a terminal portion of a signal transmitting medium to a predetermined wiring pattern (circuit); however, normally, for example shown in FIG. 20, is configured in such a manner that a receptacle connector 3 is implemented in a circuit board 2 attached to the inside of a product case 1, and a plug connector 5 to which a terminal portion of a signal transmitting medium 4 comprising a thin coaxial cable or the like is connected is fitted to the receptacle connector 3. In addition, functions of electrical connectors 3, 5 used in this case are for performing a transmission of necessary information signal through a signal wire, and connecting a shield signal for grounding to a ground circuit through a shielded wire.

Meanwhile, the downsizing/slimming down of an electronic device or the like has been rapidly progressed in recent years, and accordingly the reduction in profile and reduction in cost in an electrical connector have been achieved, and therefore the simplification of the configuration of the above-mentioned electrical connectors 3, 5 is in strong demand. In order to omit the receptacle connector 3, directly soldering a connected leg part of plug connector 5 to a conductive path on the product case 1 may be considered; however, heat resistance is low and direct soldering to the product case and implementation of an electric component are impossible, since the product case 1 is made from a resin molding material. Therefore, any commonly used electrical connector is such that provided with a fundamental configuration in which one electrical connector (receptacle connector) 3 is implemented on a printed wiring substrate 2 having a wiring pattern, and other electrical connector (plug connector) 5 is fitted to the implemented electrical connector 3. Furthermore, intending significant reduction in profile and reduction in cost has been gradually becoming difficult due to the constraints on such fundamental configuration.

SUMMARY OF THE INVENTION

Accordingly, an object of the present invention is to provide an electrical connector and an electrical connector assembly for which reduction in profile and reduction in cost can be significantly intended by a simple configuration.

To attain the object suggested above, in an electrical connector according to the present invention, an electrical connector having a connector main body to which a terminal portion of a signal transmitting medium is connected, and which is configured in such a manner that, though the connector main body thereof, a signal transmitting medium is electrically connected to a conductive path provided on the wall of a product case which constitutes an electronic device having an predetermined electronic circuit, a configuration is employed, in which a conductive contact that comes in contact with the conductive path of the product case and a pair of connected legs that protrude from said connector main body so as to face each other are provided in the connector main body, a fit fixing part formed in a beam shape extending so as to be arranged in a portion between the pair of connected legs themselves is provided in the product case, a sandwiching supporter that reciprocatably comes in contact along with the surface of the fit fixing part of the product case and sandwiches the fit fixing part of the product case in the thickness direction between the conductive contact and the connected legs is provided in the connected legs, an engagement locking part that protrudes in the thickness direction of the product case and has an inclined engaging surface approaching both of extending directions of the fit fixing part is provided in the sandwiching supporter of the connected leg, and when the connector main body moves in either one of the extending directions of the fit fixing part, the engagement locking part is fitted to the product case side through the inclined engaging surface and the connector main body is brought into a locked state in the extending directions of the fit fixing part.

According to such configuration, a stand-alone connector is directly fitted to the wall of the product case, and in the fitting state of the stand-alone connector, a contact part of a conductive contact is brought into contact with a conductive path such as a signal transmitting wiring pattern formed on the surface of a product case. Therefore, the electrical connection of a signal transmitting medium can be performed in a simple configuration requiring no involvement of a conventionally used circuit board and other electrical connector which is to be a fitting mate implemented on the circuit board, and the reduction in parts count and omitting soldering implementation become possible and thus serious cost reduction is achieved, and impedance variation is suppressed by the reduction in electrical connection point, and the problem of solder wicking in a soldering process and the problem of the impedance variation or the like are also improved, and thus the reliability of an electrical connection is improved.

In addition, the final securing of the electrical connector is performed by the connected leg of the connector main body and the conductive contact sandwiching the product case in the thickness direction, and even if the electrical connector is repeatedly fitted to/extracted from the product case, the fitting connectivity of the electrical connector for the product case is well maintained over a long period of time. Furthermore, either direction of the extending direction of fit fixing part provided in the product case is selectable for the moving direction of the connector main body until the final securing is performed, and thus the constraint on the shape of the product case becomes small, and the general versatility of the electrical connector is enhanced.

In this case, in the present invention, it is preferable that a lock locking part to which the engagement locking part can be fitted is provided in the fit fixing part of the product case.

According to such configuration, the final securing of the electrical connector is properly performed the fitting between the engagement locking part and the lock locking part.

In addition, in the present invention, a configuration is possible, in which the fit fixing part of the product case has a both side edge portion in a board width direction that is perpendicular to an extending direction of said fit fixing part, and the both side edge portion of the fit fixing part is formed by an edge portion that defines a long hole formed penetrating through the wall of the product case, and the fit fixing part is configured by a member in which a part of the wall of the product case is protruded in a cantilevered shape.

Furthermore, in the present invention, it is preferable that the engagement locking part is formed by a dimple that has been processed to form a protruding shape as a part of the sandwiching supporter, and the engagement locking part comprising said dimple is disposed at a substantially central portion in the extending direction of the sandwiching supporter.

According to such configuration, the engagement locking part is easily formed, and the abovementioned function of said engagement locking part is well obtained.

Moreover, in the present invention, it is preferable that an interference preventing recess which allows space from the connector main body and maintains the connector main body in a non-contact state when the connector main body moves in the extending directions of the fit fixing part in the fit fixing part of the product case.

According to such configuration, in the electrical connector's fitting operation, when the connector main body moves on the surface of the wall of the product case, the connector main body of the electrical connector and the product case are maintained in a non-contact state through the interference preventing recess, and the sliding contact between the connector main body and the conductive path of the product case is prevented, and therefore there would be no generation of electrical loose connection due to the sliding contact abrasion or the like of the connector main body.

Furthermore, in the present invention, it is preferable that the interference preventing recess is formed so as to be larger than a length in a moving direction of the connector main body in the conductive path with which a contact part of the interference preventing recess comes in contact, and smaller than the whole length of the connector main body.

According to such configuration, when the electrical connector is inserted into and slidably contacted with the product case, the connector main body is maintained in a non-contact state against the conductive path with which the contact part of the conductive contact comes in contact, and the sliding contact abrasion of the connector main body is properly prevented.

Furthermore, in the present invention, it is preferable that a bottom surface of the connector main body, which is arranged so as to face the surface of the product case, is such that when the connector main body moves in the extending directions of the fit fixing part, a portion not opposing to the interference preventing recess is formed in a shape more recessed than a portion opposing to the interference preventing recess.

According to such configuration, in the electrical connector's fitting operation, the non-contact state of the connector main body against the conductive path of the product case is properly maintained.

Furthermore, in the present invention, it is preferable that, in the bottom surface of the interference preventing recess, a contact part of the conductive path is provided, and a contact part of the conductive contact is arranged so as to come in contact with a contact part of the interference preventing recess.

According to such configuration, when an electrical connector is fitted, the contact part of the conductive contact is in a state engaged with interference preventing recess and a lock function is obtained, and by just that much, the lock mechanism of the electrical connector is simplified, and the local concentration of the fitting force is relieved, and thus the endurance especially in repeated attaching/detaching is improved.

As stated above, the present invention is configured in such a manner that, by a configuration in which the connected leg provided on the connector main body to which the terminal portion of the signal transmitting medium is connected is moved in either one of the extending directions of the fit fixing part provided on the product case, and the product case is sandwiched by the connected leg and the conductive contact in the thickness direction, a stand-alone connector is directly fitted to the wall of the product case, and in the fitting state of a stand-alone connector, by bringing a contact part of conductive contact into contact with a conductive path such as a signal transmitting wiring pattern formed on the surface of a product case, the electrical connection of a signal transmitting medium can be performed in a simple configuration requiring no involvement of a conventionally used circuit board and other electrical connector which is to be a fitting mate implemented on the circuit board, and the reduction in parts count and omitting soldering implementation become possible and thus serious cost reduction is achieved, and impedance variation is suppressed by the reduction in electrical connection point, and the problem of solder wicking in a soldering process and the problem of the impedance variation or the like are also improved, and thus the reliability of an electrical connection is improved, and the overall final securing of the electrical connector is performed by the connected leg of the connector main body and the conductive contact sandwiching the product case in the thickness direction, and even if the electrical connector is repeatedly fitted to/extracted from the product case, the fitting connectivity of the electrical connector for the product case is well maintained over a long period of time, and the inclined engaging surface approaching both of the extending directions of the sandwiching supporter is formed in the engagement locking part that brings the connector main body into a locked state, and thus either direction is selectable for the moving direction of the connector main body until the final securing is performed, and the constraint on the shape of the product case is made small so as to enhance general versatility, and therefore an extremely simple configuration is enabled by omitting a circuit board, an electrical connector of a fitting mate, and the like, and by the simple configuration, the downsizing, reduction in profile and reduction in cost of the electrical connector can be significantly intended.

DETAILED DESCRIPTION OF THE PREFERRED EMBODIMENTS

Hereinafter, an embodiment in a case where the present invention is applied to an electrical connector using a thin coaxial cable as a signal transmitting medium, which is configured so as to directly fit to a product case of an electronic device by inserting thereinto from the upper side and horizontally moved thereon will be described in detail with reference to the drawings.

[Electrical Connector Assembly Overall Structure]

That is, a plug connector 10 according to the first embodiment of the present invention shown in FIG. 1 to FIG. 15 is provided with a configuration for electrically connecting a terminal portion of a thin coaxial cable SC as a signal transmitting medium to a wiring pattern conductive path CP formed on the outer surface of a wall of a product case MF that constitutes an electronic device such as a mobile telephone having a predetermined electronic circuit, and a wiring pattern conductive path CP that constitutes a part of an antenna or various types of circuits is formed on the outer surface of the wall making up the product case MF by printing or the like. In addition, the shape of the product case MF is partially extracted and shown in FIG. 2 to FIG. 19.

A pair of fit connecting holes MFa, MFa are formed in parallel with each other on the wall of the product case MF so as to penetrate through the wall of product case MF, and a fit fixing part MFb formed in a beam shape is defined in a portion between a pair of those fit connecting holes MFa, MFa. Furthermore, a connected leg 10B protruding from a connector main body 10A of the plug connector 10 is configured so as to be fitted to the fit connecting holes MFa, MFa provided on the wall of the product case MF by being inserted thereinto from the upper side and horizontally moved.

Figure 1:
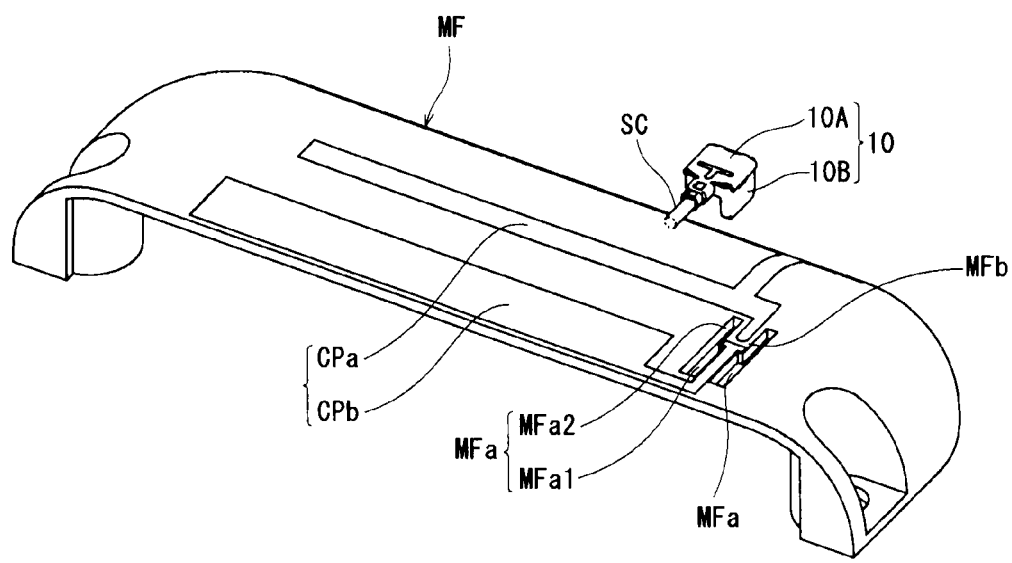
FIG. 1 is an external perspective view illustrating a state in the middle of a connection operation of a signal transmitting medium using a plug connector according to the first embodiment of the present invention.
Figure 2:
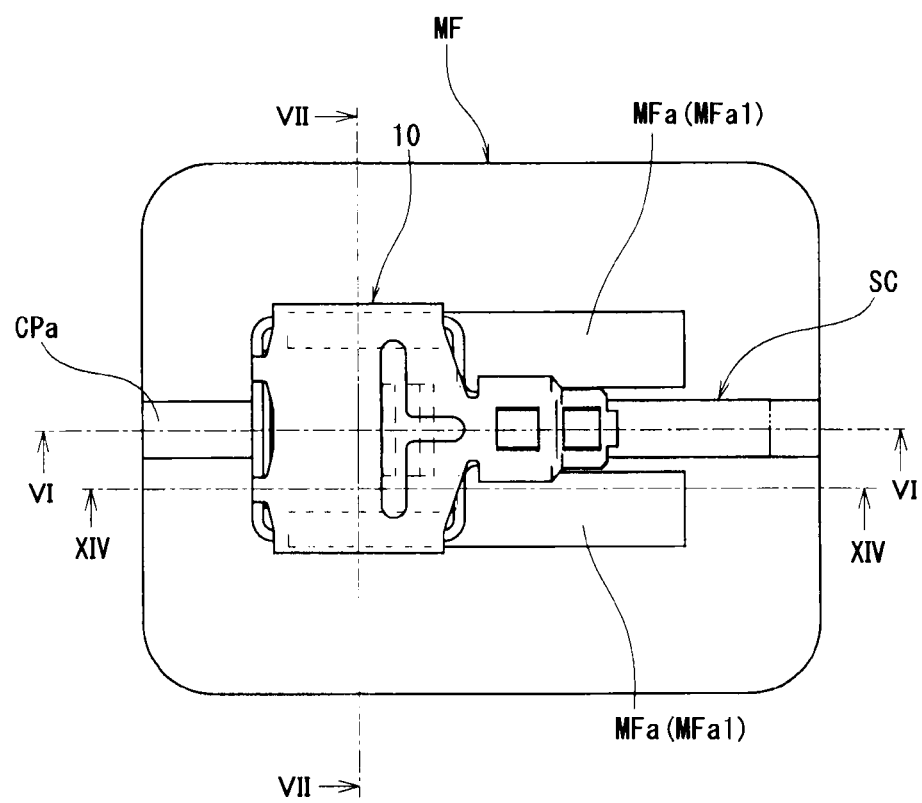
FIG. 2 is a plan view illustrating the plug connector according to the first embodiment of the present invention shown in FIG. 1 in a state after being fitted to a fit connecting hole of a product case.
Figure 10:
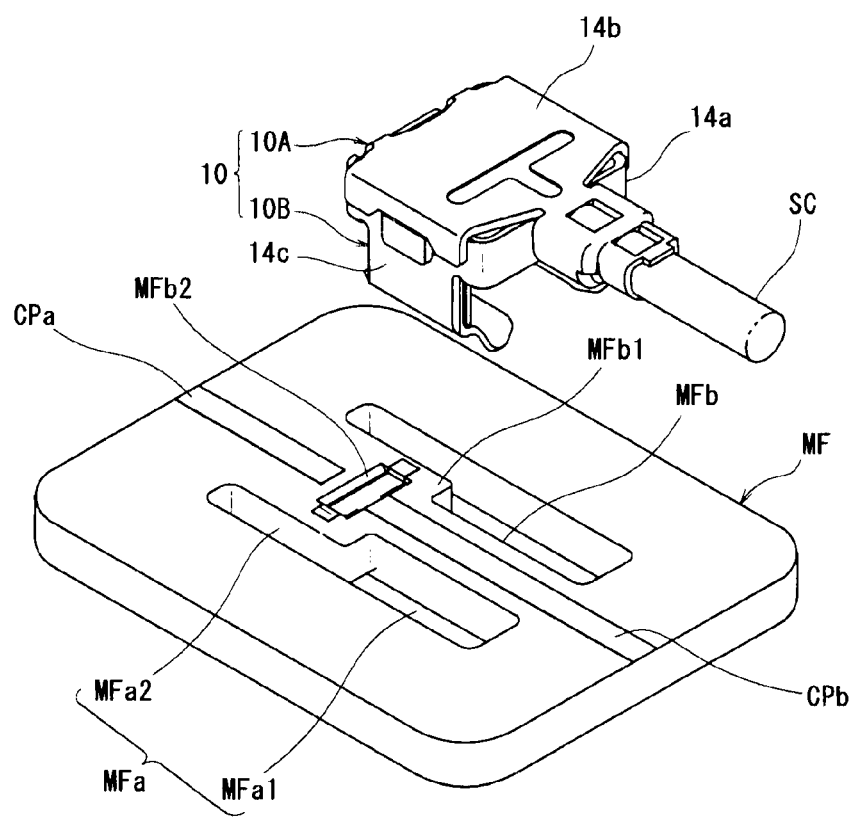
FIG. 10 is an external perspective view illustrating the plug connector according to the first embodiment of the present invention shown in FIG. 1 from the rearward side in a state before being fitted to the fit connecting hole of the product case.
Figure 11:
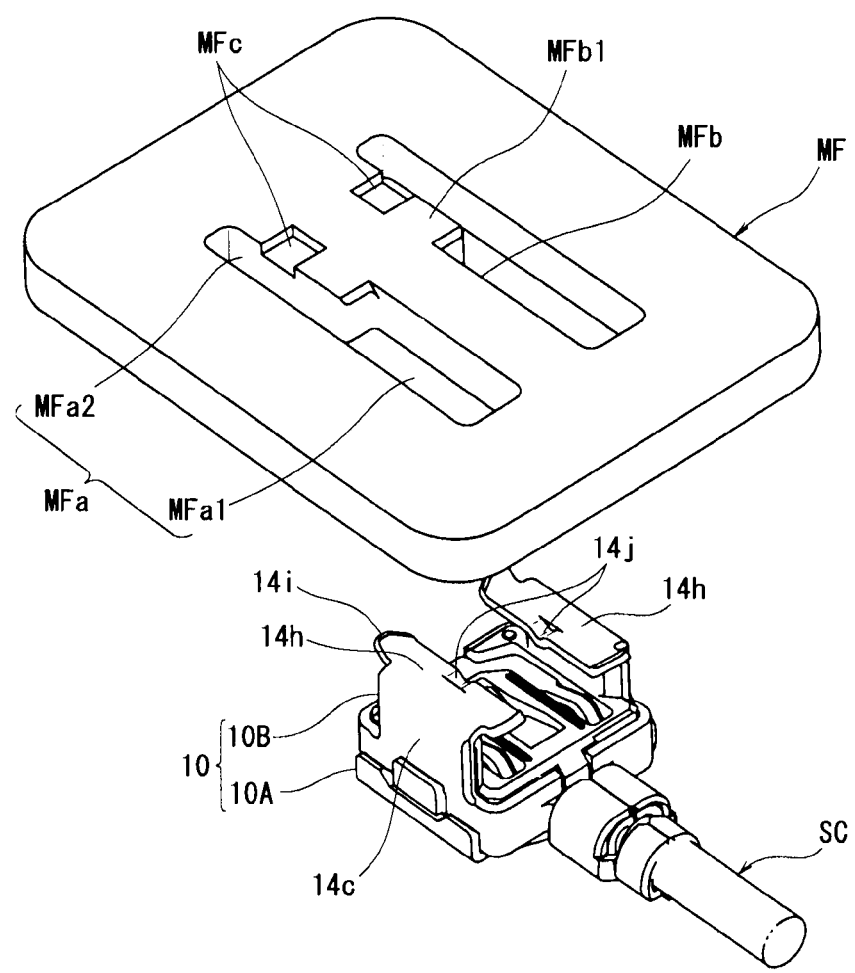
FIG. 11 is a perspective view illustrating the plug connector and fit connecting hole in the state of FIG. 10 when viewed from the inner side of the product case.
Figure 12:
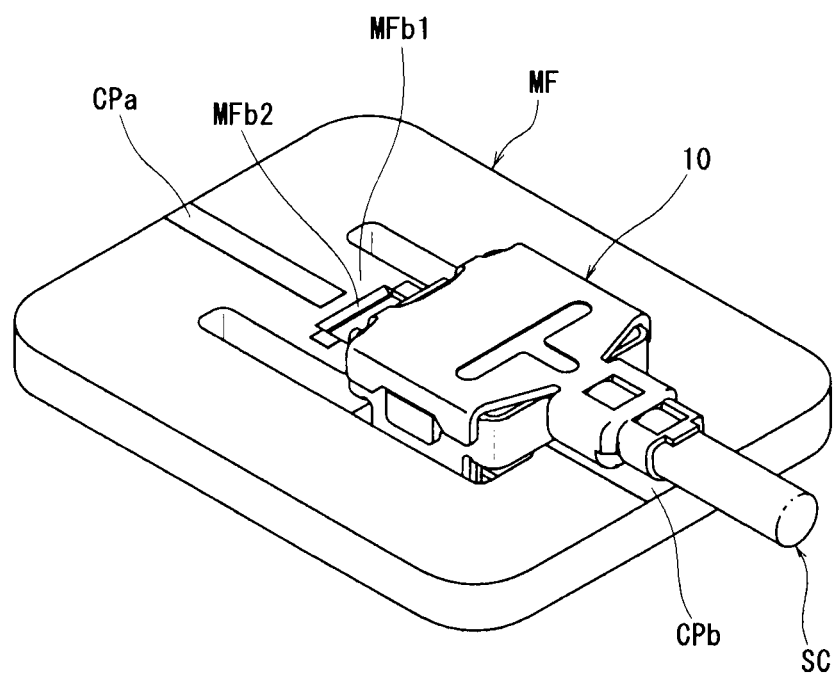
FIG. 12 is an external perspective view illustrating a state in which the plug connector is inserted into the fit connecting hole of the product case from the state of FIG. 10.
Figure 13:
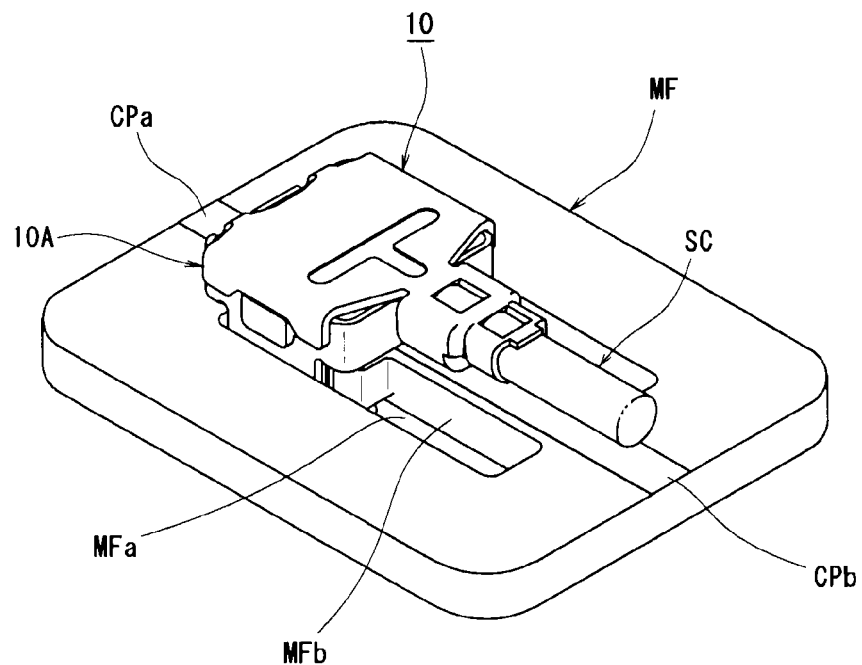
FIG. 13 is an external perspective view illustrating a fitting state in which the plug connector is moved further forward from the state of FIG. 12.
Figure 14:
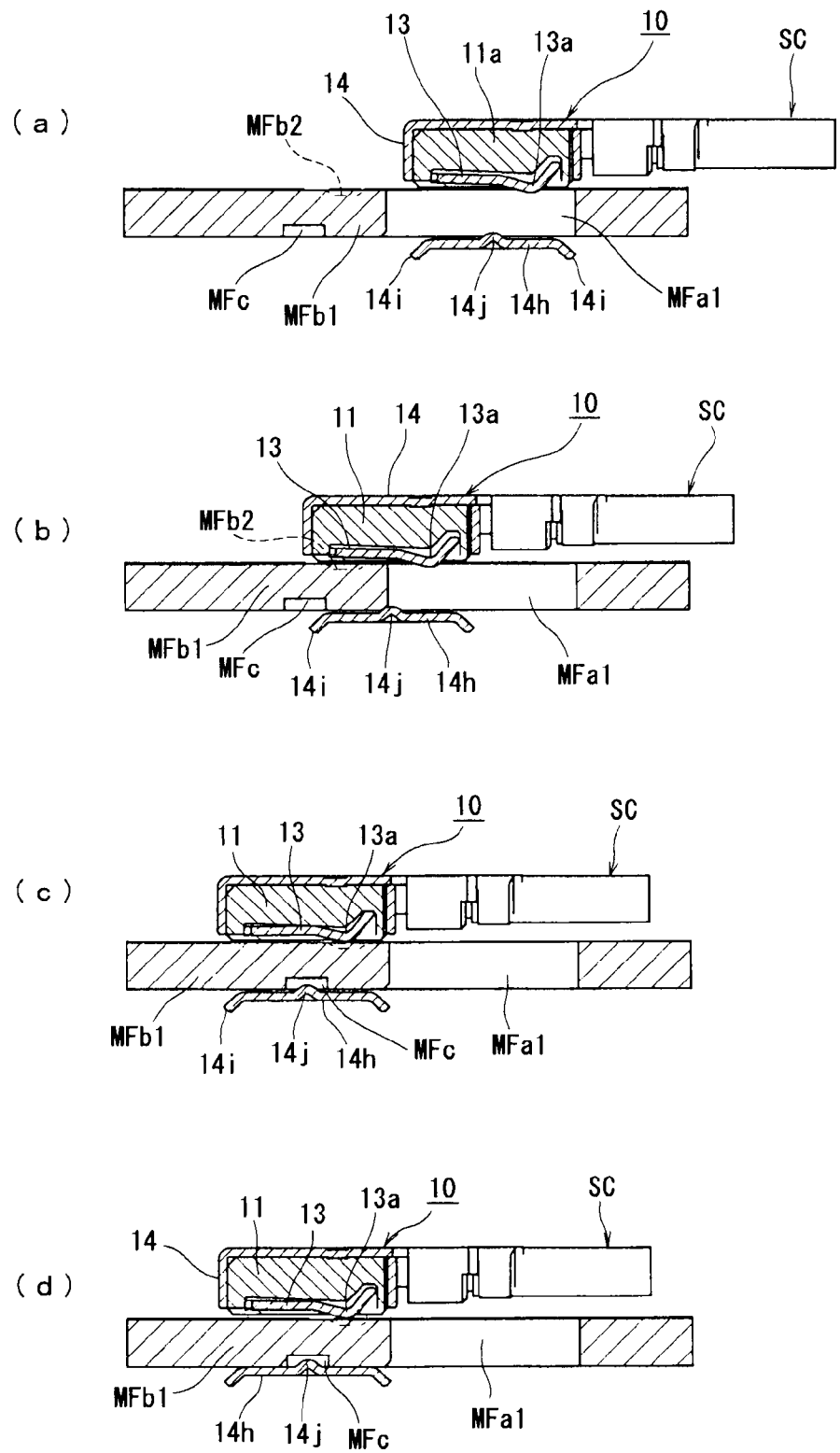
FIG. 14 shows a step for moving the plug connector in the initial inserted state shown in FIG. 12 forward to the fitting state of FIG. 13 by the longitudinal section along the line XIV-XIV in FIG. 2, and (a) shows the initial inserted state of the plug connector, (b) shows a state in which an engagement locking part runs onto an end edge portion of a fixed main board of a fit fixing part, (c) shows a state in which the engagement locking part is fitted to a lock locking part, and (d) shows a state in which a wall of the product case is sandwiched between a connected leg of the plug connector and a conductive contact.

That is, the terminal portion of the thin coaxial cable SC as a signal transmitting medium is connected to the connector main body 10A of the plug connector 10, and first, the plug connector 10 to which the thin coaxial cable SC is connected is arranged so as to face with the upper side of the fit fixing part MFb as illustrated in FIG. 1 and FIG. 10. Furthermore, the whole body of the plug connector 10 disposed on the upper side thereof is moved down in a direction substantially perpendicular to the outer surface of the wall of product case MF, and as illustrated in FIG. 12 and FIG. 14(*a*), the connected leg 10B of the plug connector 10 is moved along with the outer surface of the product case MF after being inserted into the inside of the abovementioned fit connecting hole MFa, thereby being fitted to the fit fixing part MFb.

As stated above, in the fitting state in which the plug connector 10 is inserted into and moved to the fit connecting hole MFa of the product case MF, the terminal portion of the thin coaxial cable SC is connected to the wiring pattern conductive path CP through the plug connector 10, and hereinafter a direction for plugging the plug connector 10 is referred to as "downward direction", whereas an extraction direction for extracting same is referred to as "upward direction". In addition, in the plug connector 10, an end edge portion to which the terminal portion of the thin coaxial cable SC is connected is referred to as "back end edge portion", an end edge portion in the opposite side is referred to as "front end edge portion", and a direction toward the "front end edge portion" from the "back end edge portion" is referred to as "forward", and the opposite direction thereof is referred to as "rearward". Furthermore, a direction perpendicular to those "upward and downward direction" and "anteroposterior direction" is referred to as "right and left direction".

[Product Case]

Here, as mentioned above, the fit connecting hole MFa formed on the wall of the product case MF is formed by a pair of through-holes which are arranged adjacent to each other so as to be substantially axisymmetric, and end edge portions in the sides in which these paired fit connecting holes MFa, MFa are adjacent are formed in both side edge portion of the abovementioned fit fixing part MFb. That is, the fit fixing part MFb formed in a beam shape that extends in an anteroposterior direction as stated above is configured in such a manner that both side edge portion in a board width direction perpendicular to the extending direction thereof forms an inside edge portion of the fit connecting holes MFa, MFa which comprises an elongate hole formed penetrating through the wall of the product case.

Each of those fit connecting holes MFa comprises a long hole extending in an elongated shape so as to correspond to the anteroposterior direction of the abovementioned plug connector 10, and is provided in such a manner that an inserting hole MFa1 and a fitting hole MFa2 that comprise a long hole having a different opening shape communicate with each other in the anteroposterior direction, corresponding to the rearward side and forward side of the plug connector 10, respectively. The long hole that constitutes the inserting hole MFa1 arranged in the rearward side is configured in such a manner that the longitudinal direction of the long hole becomes the anteroposterior direction, and is provided with a major axis that extends in the anteroposterior direction so as to allow a movement in the anteroposterior direction of the connected leg 10B of the plug connector 10.

In addition, the long hole that constitutes the inserting hole MFa1 is provided with a minor axis that extends in the right and left direction, and the size of the minor axis is relatively widely formed to an extent that the whole of the connected leg 10B of the abovementioned plug connector 10 becomes insertable. By this relatively wide minor axis, the connected leg 10B of the abovementioned plug connector 10 may be arbitrarily inserted or withdrawn through the inserting hole MFa1.

Meanwhile, the long hole that constitutes the fitting hole MFa2 disposed in the forward side of such inserting hole MFa1 is provided with a major axis that extends in the anteroposterior direction as is the case with the abovementioned inserting hole MFa1, and thus has the similar configuration in allowing the connected leg 10B of the plug connector 10 to move in the anteroposterior direction, and has a minor axis narrower than the inserting hole MFa1. The minor axis of this fitting hole MFa2 is formed in a size to an extent that only an intermediate portion in a direction toward the height of the connected leg 10B becomes insertable, and a wide lower end portion of the connected leg 10B is uninsertable. Therefore, in the inside of this fitting hole MFa2, only the intermediate portion in the direction toward the height of the connected leg 10B, which is inserted from the abovementioned inserting hole MFa1 is insertable. Furthermore, the connected leg 10B inserted into the inside of the fitting hole MFa2 through the inserting hole MFa1 is allowed to move in the longitudinal direction (anteroposterior direction) of the long hole that constitutes the fitting hole MFa2, while may not be withdrawn in the height direction and get out from the fitting hole MFa2.

More specifically, an opening edge portion of the fit connecting hole MFa which comprises the long hole that constitutes these inserting hole MFa1 and fitting hole MFa2 extends in an elongated shape corresponding to the anteroposterior direction of the plug connector 10, and an outside edge portion in the right and left direction of the opening edge portion is formed in a linear common edge portion that extends continuously from the abovementioned inserting hole MFa1 to the fitting hole MFa2. On the other hand, the inner side edge portion in the fit connecting hole MFa2, that is, the end edge portion that forms an outer shape of the abovementioned fit fixing part MFb is formed in a shape like a substantially squared staircase pattern in the boundary portion with the inserting hole MFa1, and a fixed main board MFb1 having a shape that slightly projects to the outer side in the right and left direction is provided on the forward side portion of the fit fixing part MFb. Furthermore, the connector main body 10A of the plug connector 10 is configured to be eventually in a state fitted to this fixed main board MFb1.

In addition, as stated above, the opening shape of each fit connecting hole MFa which comprises the inserting hole MFa1 and the fitting hole MFa2 forms a bilaterally-symmetric shape in the internal and external edge portions of both sides, and may be formed in an asymmetrically different rotationally asymmetric shape. In that case, as described later, the connected leg 10B of the plug connector 10 inserted into the inside of the fit connecting hole MFa is configured to be rotationally asymmetric corresponding to the rotationally asymmetric opening shape in the fit connecting hole MFa, and if a projection geometry in the fitting direction of the connected leg 10B is made to have a rotationally asymmetric shape in a horizontal plane perpendicular to an inserting-fitting direction (downward direction), when fitting/inserting the connected leg 10B of the plug connector 10 to the connecting hole MFa, in a case where the plug connector 10 is erroneously arranged in the opposite side of the rotation direction, the fitting itself becomes impossible, and thus improper fitting prevention can be achieved.

Furthermore, out of the front-back both surfaces of the fixed main board MFb1 which is provided on the forward side of the fit fixing part MFb that defines the fit connecting holes MFa, MFa in this way, an outwardly exposed surface is provided with an interference preventing recess MFb2 in a portion between the abovementioned a pair of the fitting hole MFa2, MFa2. When the plug connector 10 moves in the longitudinal direction of the fit connecting hole MFa, that is, the extending direction of the fit fixing part MFb, this interference preventing recess MFb2 allow space from the connector main body 10A and maintains same in a non-interference state, and the detailed structure will be described later as a sliding friction interference preventing structure.

Meanwhile, as mentioned above, the terminal portions of a signal conductive path CPa that constitutes the wiring pattern conductive path CP and ground conductive path CPb are formed on the surface that constitutes the outwardly exposed surface of the front-back both surfaces of the product case MF. The terminal portion of these wiring pattern conductive paths CP are arranged so as to extend in the anteroposterior direction in an area including the fit fixing part MFb that is an area between the abovementioned a pair of fit connecting holes MFa, MFa. The terminating end portions of those signal conductive path CPa and the ground conductive path CPb are arranged so as to face being spaced from each other in the anteroposterior direction in the fixed main board MFb1 that constitutes the forward side portion of the fit fixing part MFb, that is, the inner side portion of the fitting hole MFa2. In addition, the product case mentioned in the present invention does not have to be formed in a shape of a box, and may be such that makes up a part of the wall surface that constitutes an electronic device such as a mobile telephone.

[Plug Connector]

In addition, the plug connector 10 has, as mentioned above, a configuration for being inserted into the fit connecting hole MFa from the upper side and horizontally moved, thereby being fitted to the fixed main board MFb1 that constitutes the forward side portion of the fit fixing part MFb, and the terminal portion of the thin coaxial cable SC as one example of a signal transmitting medium is connected to the back end edge portion of the connector main body 10A of the plug connector 10. Hereinafter, each end edge portion of the fit connecting hole MFa, which corresponds to the back end edge portion and front end edge portion of the plug connector 10, will be referred to as the back end edge portion and front end edge portion in the same way.

[Coaxial Cable]

Figure 6:
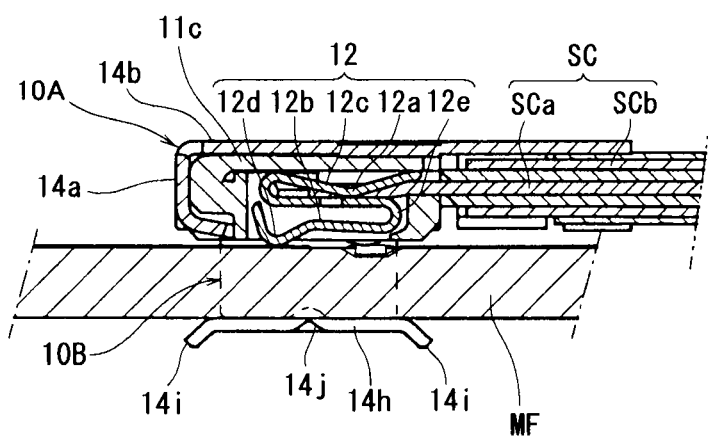
FIG. 6 is a view illustrating a longitudinal section along a line VI-VI in FIG. 2.
Figure 8:
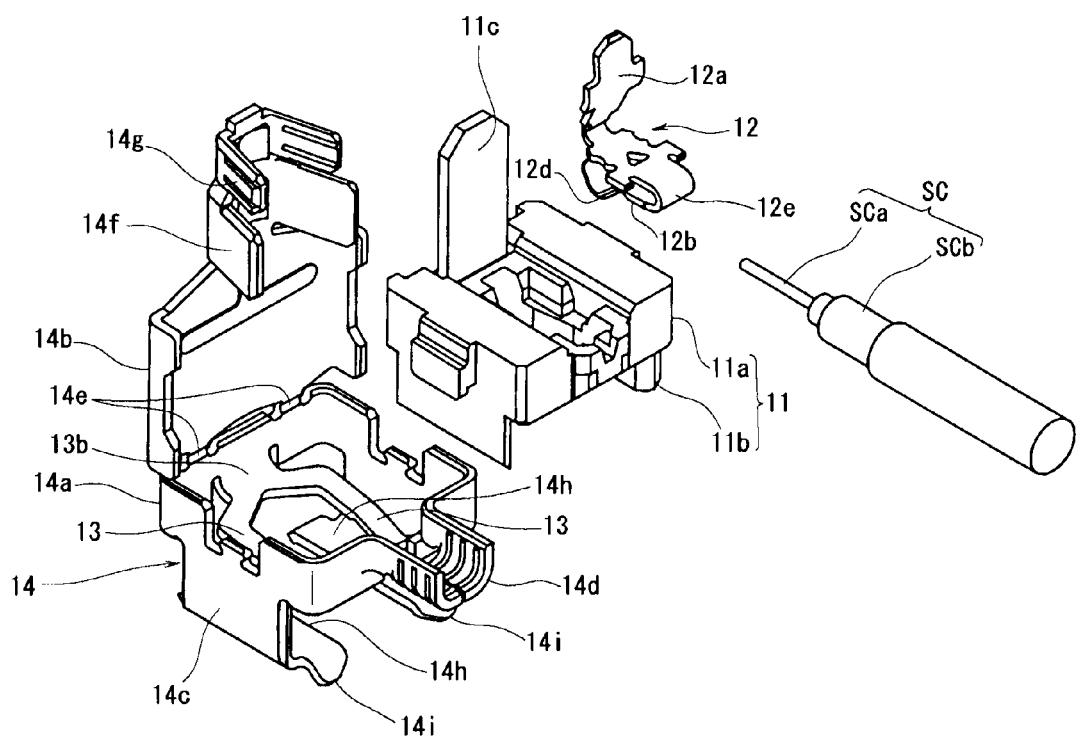
FIG. 8 is an exploded perspective view illustrating an initial state of the plug connector shown in FIG. 1 to FIG. 7 from the rearward side before setting a thin coaxial cable as a signal transmitting medium thereto.

As illustrated in FIG. 6 or FIG. 8, the terminal portion of the thin coaxial cable SC as a signal transmitting medium is exposed in such a manner that a cable center conductor (signal wire) conductor SCa and a cable outer conductor (shielded wire) SCb form a coaxial shape by a periphery coating material being peeled, and the cable center conductor SCa arranged along a central axis line of the thin coaxial cable SC is connected to a signal transmitting conductive terminal (signal contact) 12 that is attached to an insulating housing 11, thereby constituting a signal circuit. In addition, the cable outer conductor SCb arranged so as to surround the periphery side of the abovementioned cable center conductor SCa is connected to a grounding conductive terminal (ground contact) 13 unitedly provided on an after-mentioned shielded shell 14, thereby constituting a ground circuit.

[Insulating Housing]

The insulating housing 11 of such plug connector 10 integrally has an insulating main body 11a and an insulation inserting part 11b corresponding to each of the abovementioned connector main body 10A and the connected leg 10B. In the substantially central portion of the insulating main body 11a of them, in addition to the abovementioned thin coaxial cable SC, the signal transmitting conductive terminal (signal contact) 12 is attached, and a grounding conductive terminal (ground contact) 13 is attached through an after-mentioned shielded shell 14 so as to be disposed on the both sides of the signal transmitting conductive terminal 12.

In addition, the insulation inserting part 11b is formed from a pair of lamellate members protruding downward from the insulating main body 11a, and those pair of insulation inserting parts 11b is configured to be inserted from the lower end portion toward the inside of the fit connecting hole MFa of the product case MF side, which is a fitting mate. Furthermore, as shown mainly in FIG. 5, in an inner portion (connector central side portion) in which a pair of insulation inserting parts 11b, 11b face each other, the bottom surface of the insulating main body 11a that makes up the bottom surface of the connector main body 10A extends so as to face the surface of the product case MF. Furthermore, in the bottom surface of the insulating main body 11a that constitutes the insulating housing 11, the contact part 12d of the signal contact 12 and the grounding conductive terminal (ground contact) 13 are disposed so as to expose outward, and a central side bottom surface 11d is formed to make up a part of the bottom surface of the connector main body 10A between the contact part 12d of the signal contact 12 and the grounding conductive terminal 13, and an outer side bottom surface 11e is also formed to make up a part of the bottom surface of the connector main body 10A in the outer end portion of the grounding conductive terminal 13 in the anteroposterior direction.

A step is formed between these central side bottom surface 11d and outer side bottom surface 11e which make up a part of the bottom surface of the connector main body 10A in order to maintain the connector main body 10A in a non-contact state when the plug connector 10 moves in the longitudinal direction of the fit connecting hole MFa, that is, the extending direction of the fit fixing part MFb, and the detailed structure will be described below as a sliding friction interference preventing structure.

[Shielded Shell]

Furthermore, the outer surface of the insulating housing 11 that has the abovementioned insulating main body 11a and insulation inserting part 11b is covered by a shielded shell 14 comprising a sheet-metal member. This shielded shell 14 is comprised of, as shown especially in FIG. 8, a shell main body 14a as the connector main body 10A which circularly covers the periphery side surface of the insulating main body 11a of the insulating housing 11, a shell lid 14b as the connector main body 10A which similarly coves the upper surface portion of the insulating main body 11a of the insulating housing 11 and a shell inserting part 14c as the connected leg 10B covers the insulation inserting parts 11b provided on a pair in the insulating housing 11 from the outer side. A cable supporting part 14d that forms a longitudinal section substantially half circular shape is provided so as to protrude substantially horizontally toward the rearward side in the posterior end portion of the shell main body 14a of these, and the terminal portion of the abovementioned thin coaxial cable SC may be placed and received in the inner wall surface of the cable supporting part 14d.

Figure 9:
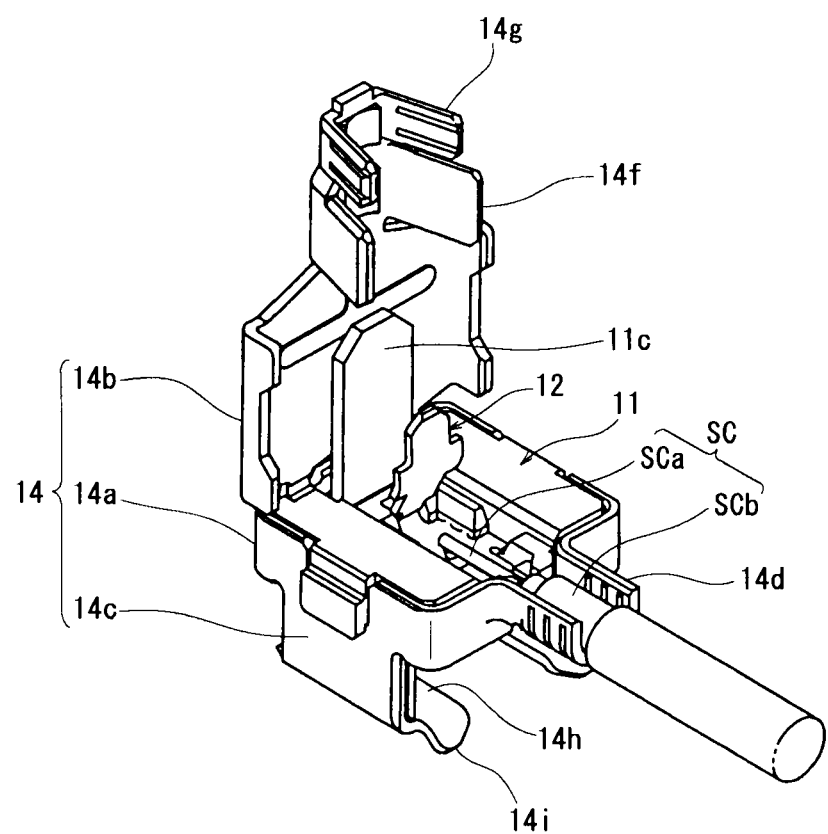
FIG. 9 is an external perspective view illustrating the plug connector shown in FIG. 8 from the rearward side in a state in which a thin coaxial cable as a signal transmitting medium is set thereto.

In this case, the shell lid 14b of the shielded shell 14 is configured to be a patulous state such as that shown in FIG. 8 and FIG. 9 in the initial state before connecting and fixing the terminal portion of the abovementioned thin coaxial cable SC. That is, the shell lid 14b in the initial state is disposed so as to rise up substantially vertically upward in the opposite side of the abovementioned cable supporting part 14d, that is, the anterior end portion of the shell main body 14a through bridging members 14e,14e comprising a pair of narrow shaped members. In addition, in the inner side of the shell lid 14b, an insulation pressing board 11c which rises up upward from the insulating main body 11a of the insulating housing 11 is disposed along the inner surface of the shell lid 14b. In addition, the placing position and placing number of the abovementioned bridging member 14e is arbitrarily selectable.

Furthermore, in the patulous state of the abovementioned shielded shell 14, after the terminal portion of the thin coaxial cable SC is placed and set so as to be received by the cable supporting part 14d as shown in FIG. 9, the shell lid 14b of the shielded shell 14 is pushed down until a substantially horizontal state in such a manner that the bridging member 14e is bent along with the insulation pressing board 11c at a substantially right angle. Thus, the insulating main body 11a of the insulating housing 11 is covered by the shell lid 14b from the upper side, and the shielded shell 14 is brought into an occluded state.

The shell lid 14b in this case is configured to be capped so as to cover from the upper side portion of the shell main body 14a to the outside portion, and also to be capped so as to cover the upper side portion to the outside portion of the abovementioned cable supporting part 14d and thin coaxial cable SC. That is, in the shell lid 14b, at the positions corresponding to the cable supporting part 14d and thin coaxial cable SC, a first holder 14f and a second holder 14g are provided so as to form a cross-sectional U-shape. In these first holder 14f and second holder 14g, the patulous side portion in the cross-sectional U-shape is formed so as to face the cable supporting part 14d and thin coaxial cable SC, and as mentioned above, is configured to cover the abovementioned cable supporting part 14*d* and thin coaxial cable SC in a longitudinal sectional U-shape when the shell lid 14*b* is pushed down until a substantially horizontal state. Furthermore, the leading end of both side panel shaped member which constitutes the patulous portion of those first holder 14*f* and second holder 14*g* is bent to the inner side and fixed by a swage, and the cable outer conductor SCb is brought into contact with the cable supporting part 14*d* and the first holder 14*f*, thereby constituting a ground circuit by the shielded shell 14.

[Ground Contact]

In addition, the aforementioned grounding conductive terminal (ground contact) 13 is unitedly provided on the shell main body 14*a* of the shielded shell 14, and has an elastic arm part comprising a cantilevered member that is bent to form a two-forked shape at a substantially right angle from the front end surface of the shell main body 14*a* and extends to the rearward side. The elastic arm part which constitutes each of the grounding conductive terminals 13, 13 that are formed so as to branch into those two-forked shapes are disposed at an outer position at the right and left sides at which the thin coaxial cable SC and signal transmitting conductive terminal (signal contact) 12 are sandwiched, and the contact parts 13*a*, 13*a* (see FIG. 15) are provided on the leading end of extending side (back end side) of the elastic arm part of the grounding conductive terminal 13, 13 so as to form a concave shape. Each contact part 13*a* of those is configured to be elastically displaced in the upward and downward direction being two-forked in the right and left direction centering on a swinging support point 13*b* that is formed in the proximal end side adjacent to the front end surface of the shell main body 14*a*. Furthermore, when the plug connector 10 is fitted to the product case MF, the contact part 13*a* of the grounding conductive terminal 13 is brought into contact with the ground conductive path CPb formed on the outside surface of the product case MF from the upper side.

In this case, the bridging member 14*e* which connects the shell main body 14*a* and the shell lid 14*b* is provided at a position not facing the swinging support point 13*b* of the abovementioned grounding conductive terminal (ground contact) 13 in the bending direction of the bridging member 14*e*.

According to this configuration, when the shell lid 14*b* is connected so as to be mounted on the shell main body 14*a* and the bridging member 14*e* is bent, the influence of bending the bridging member 14*e* hardly spreads out to the grounding conductive terminal (ground contact) 13, and the deformation or the like of the grounding conductive terminal 13 can be prevented. Therefore, according to the position of the bridging member 14*e*, the position of the swinging support point 13*b* may be changed as appropriate.

In addition, the abovementioned shell main body 14*a* and shell inserting part 14*c* are disposed respectively to form a vertical wall shape on the both sides of right and left outer portions of the abovementioned grounding conductive terminals 13, 13, and the shell inserting part 14*c* of those is formed by a plate shaped member that extends downward from the shell main body 14*a* so as to form a cantilevered beam shape. This shell inserting part 14*c* constitutes a part of the abovementioned connected leg 10B, and if the connected leg 10B is unitedly formed with the shielded shell 14 in that manner, the connected leg 10B is efficiently shaped simultaneously with the shape forming of the shielded shell 14, and thus the improvement in productivity is can be achieved.

Furthermore, a sandwiching supporter 14*h* comprising an inner side bent piece that is bent at a substantially right angle toward the inner side (central side) of the right and left direction and formed in a protruding shape is provided on the lower end portion of the shell inserting part 14*c*. This sandwiching supporter 14*h* extends from the inside edge portion of the aforementioned the fit connecting hole MFa2 to the back surface (lower surface) side of the fit fixing part MFb and is formed in a shape covering the both end edge portions of the fixed main board MFb1 of the fit fixing part MFb from the lower side, and the inner side excrescence quantity (board width) is limited and adjusted so as to be insertable into the abovementioned inserting hole MFa1 and uninsertable into the fit connecting hole MFa2. Furthermore, the shell inserting part 14*c* inserted into the inserting hole MFa1 move forward to the fit connecting hole MFa2 of the forward side, and thus the sandwiching supporter 14*h* is pressed against the back surface side of the fit fixing part MFb and brought into a fitting state.

The sandwiching supporter 14*h* provided on the lower end portion of this shell inserting part 14*c* is arranged so as to be a substantially parallel state at a substantially immediately below position of the abovementioned grounding conductive terminal (ground contact) 13, and these both members 14*h*, 13 are arranged in a positional relationship for facing each other in the upward and downward direction. The distance between the general surfaces of the both members 14*h*, 13 themselves of this case is set to be slightly larger than the thickness of the product case MF, and the abovementioned wall of the product case MF is configured to become embedded in a space formed between those sandwiching supporter 14*h* and grounding conductive terminal 13 without trouble.

In this case, the anteroposterior leading end edge portions in the abovementioned sandwiching supporter 14*h* are provided with a movement guides 14*i*, 14*i* which are formed to be inclined toward the lower side. The inclined surfaces of these movement guides 14*i*, 14*i* have a guide action for the end edge corner portion of the fixed main board MFb1 that constitutes the forward side portion of the fit fixing part MFb, and as mentioned above, when the shell inserting part 14*c* moves in the anteroposterior direction between the inserting hole MFa1 and the fit connecting hole MFa2, the leading end of the sandwiching supporter 14*h* can be smoothly inserted into the end edge corner portion of the fixed main board MFb1 without interfering therein.

Figure 15:
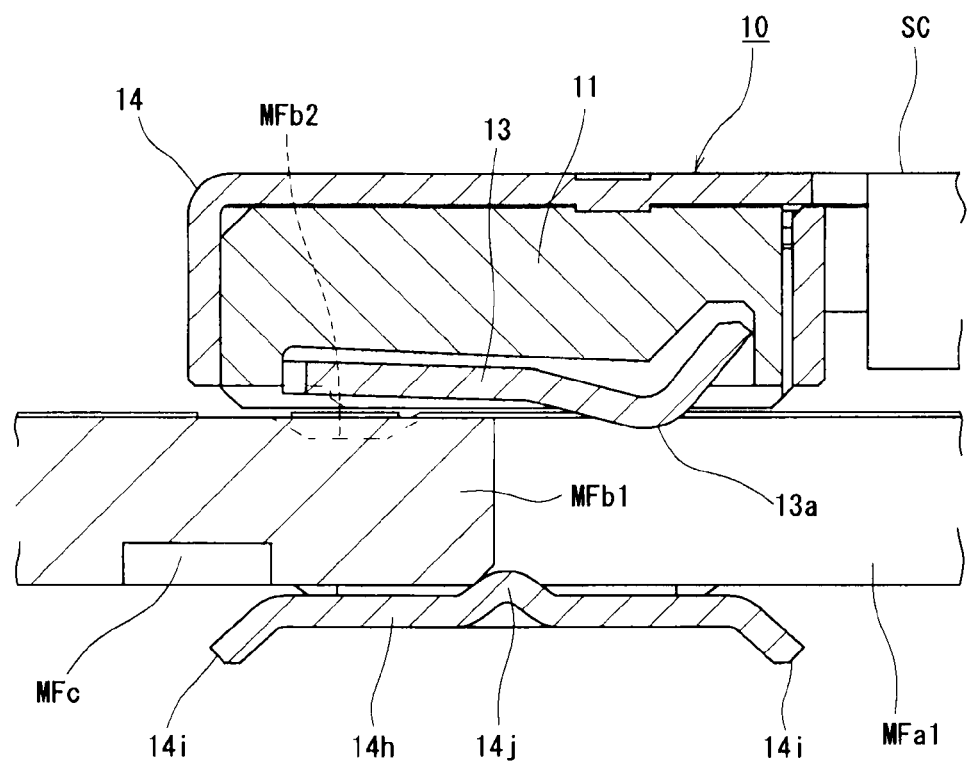
FIG. 15 is a partially longitudinal sectional view illustrating an enlarged portion of (b) in FIG. 14.

Moreover, in the sandwiching supporter 14*h* of the abovementioned connected leg 14, an engagement locking part 14*j* is provided in a protruding manner so as to form a convexity toward the upper side in a substantially central portion in a longitudinal direction that is the extending direction of the sandwiching supporter 14*h* (see FIG. 15). This engagement locking part 14*j* is formed by a so-called dimple that is pressed so as to form a protruding shape in the aforementioned sandwiching supporter 14*h* that forms a part of the connected legs 14, and has both in the front and in the rear inclined engaging surfaces approaching both of the extending direction (anteroposterior direction) of the sandwiching supporter 14*h*. In addition, the engagement locking part 14*j* is arranged to face the lower side of the grounding conductive terminal (ground contact) 13 in the thickness direction of the product case MF, and the distance between the top of the engagement locking part 14*j* of these and the contact part 13*a* of the grounding conductive terminal 13 is set to be slightly smaller than the thickness of product case MF. Thus, the product case MF is configured to be sandwiched between those engagement locking part 14*j* and contact part 13*a* of the grounding conductive terminal 13 in the thickness direction. The structure and effect of this engagement locking part 14*j* will be described later.

In this embodiment as stated above, the fit fixing part MFb and the fit connecting hole MFa of the product case MF are formed to form an elongated shape in the anteroposterior direction, and configured to allow that the connected leg 10B of the plug connector 10 inserted into the inside of the fit connecting hole MFa of the product case MF reciprocates in the longitudinal direction (anteroposterior direction) that is the major axis direction of the long hole. Specifically, the fitting operation of the connected leg 10B of the plug connector 10 is, as shown in FIG. 14(a) to (d), such that the connected leg 10B of the plug connector 10 is firstly inserted into the inside of the inserting hole MFa1 that is arranged in the rearward side of the fit connecting hole MFa so as to be penetrated therethrough, and then the connected leg 10B is moved forward the fitting hole MFa2 in the forward side. The movement of the connected leg 10B in this case is smoothly performed by is the guide action of the inclined surface of the movement guide 14i.

By such forward movement of the connected leg 10B of the plug connector 10, the engagement locking part 14j provided on the connected leg 10B, a pair of contact parts 13a provided on the grounding conductive terminal (ground contact) 13 and the contact part 12d of the after-mentioned signal contact 12 are configured to sandwich the fixed main board MFb1 that constitutes the forward side portion of the fit fixing part MFb provided on the product case MF in the thickness direction. In addition, the connected leg 10B of the plug connector 10 can be moved backward toward the inserting hole MFa1 in the rearward side from the fitting hole MFa2 disposed in the forward side of the fit connecting hole MFa, and by the backward movement, the connected leg 10B of the plug connector 10 and the grounding conductive terminal 13 are withdrawn from the fixed main board MFb1 of the fit fixing part MFb in the product case MF and brought into an extractable state.

As stated above, in this embodiment, the stand-alone plug connector 10 is directly fitted to the fit fixing part MFb provided on the wall of the product case MF, and in the fitting state of the stand-alone plug connector 10, each contact part of the signal transmitting conductive terminal (signal contact) 12 and the grounding conductive terminal (ground contact) 13 is brought into contact with the wiring pattern conductive path CP such as a signal transmitting wiring pattern formed on the surface of the product case MF. Therefore, the electrical connection of a signal transmitting medium can be performed in a simple configuration requiring no involvement of a conventionally used circuit board and other electrical connector which is to be a fitting mate implemented on the circuit board, the reduction in parts count and omitting soldering implementation become possible, and thus serious cost reduction is achieved, and impedance variation is suppressed by the reduction in electrical connection point, and the problem of solder wicking in a soldering process and the problem of the impedance variation or the like are also improved, and thus the reliability of an electrical connection is improved.

In addition, the overall final securing of the plug connector 10 is performed by the connected leg 10B of the connector main body 10A and the grounding conductive terminal (ground contact) 13 sandwiching the product case MF in the thickness direction, and thus even if the plug connector 10 is repeatedly fitted to/extracted from the product case MF, the fitting connectivity of the plug connector 10 for the product case MF is well maintained over a long period of time.

Furthermore, in this embodiment, a lock locking part MFc for receiving the engagement locking part 14j of the abovementioned sandwiching supporter 14h is provided in a recess form in the back surface side (lower surface side) of the product case MF. This lock locking part MFc comprises a hole part which is formed so as to cut off a part of, the fixed main board MFb1 that constitutes the forward side portion of the fit fixing part MFb, that is, the inner end edge of the forward side fitting hole MFa2, and when the connected leg 10B of the plug connector 10 is moved forward from the rearward side inserting hole MFa1 to the forward side fitting hole MFa2 in the manner as mentioned above, the engagement locking part (engagement locking part) 14e provided on the sandwiching supporter 14h is dropped into the inside of the lock locking part MFc in a step shape and brought into a fitting state.

Meanwhile, the engagement locking part 14j in this embodiment is configured to, as mentioned above, have both in the front and in the rear inclined engaging surfaces approaching both of the anteroposterior directions, and as mentioned above, after the engagement locking part 14j is dropped into the lock locking part MFc, if the whole body of the plug connector 10 is displaced positionally either forward or backward, either of inclined engaging surfaces provided in the back and forth of the engagement locking part 14j comes in contact with the inner wall surface of the abovementioned lock locking part MFc, and thus the connector main body 10A is locked in the anteroposterior direction, and the whole body of the plug connector 10 is held in an immobile state. In addition, the locking action toward forward side for the plug connector 10 is performed by the connected leg 10B coming in contact with the front end edge of the abovementioned forward side fitting hole MFa2.

As stated above, if a configuration in which the engagement locking part 14j provided on the fit fixing part MFb of the connected leg 10B is fitted to the lock locking part MFc comprising the hole part of the product case MF is employed, the fit between the engagement locking part 14j and the lock locking part MFc is improved, and the holding of the plug connector 10 is properly performed. In addition, if the engagement locking part 14j is formed by a dimple in the manner as this embodiment, the engagement locking part 14j is easily formed.

Figure 7:
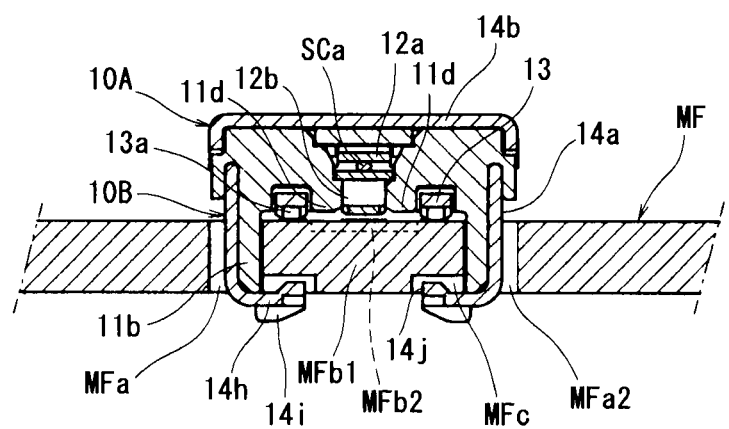
FIG. 7 is a view illustrating a longitudinal section along a line VII-VII in FIG. 2.

Furthermore, in this embodiment, in the fitting state especially shown in FIG. 7 and FIG. 14(d), that is, the state in which the contact part 13a of the grounding conductive terminal (ground contact) 13 comes in contact with the wiring pattern conductive path CP provided on the product case MF, the elastic arm part of the grounding conductive terminal 13 emerges upward from the surface of the product case MF by the elastic spring force of the grounding conductive terminal 13, a gap is formed between the upper surface of the product case MF and the bottom surface of the insulating main body 11a, which is a surface facing the upper surface of the product case MF, and similarly a gap is formed between the upper surface of the product case MF and the elastic arm part of the grounding conductive terminal 13, which is a surface facing the upper surface of the product case MF.

[Signal Contact]

In addition, the signal transmitting conductive terminal (signal contact) 12 in this embodiment is attached to the insulating main body 11a of the insulating housing 11 by pressing or insert molding or the like, and has as especially shown in FIG. 6, a cable sandwiching part 12a connected to the cable center conductor (signal wire) SCa of the abovementioned thin coaxial cable SC and an elastic spring part 12b that extends in a curved shape from the cable sandwiching part 12a toward the lower side and comes in contact with the signal conductive path CPa of the wiring pattern conductive path CP.

The cable sandwiching part 12a of those has a clip beam structure which is bent to form a substantially C-shape in a side view, and is formed to sandwich the cable center conductor (signal wire) SCa of the thin coaxial cable SC from above and below in a clip shape. At the intermediate portion of the upper-side beam part 12c that constitutes this cable sandwiching part 12a, a recess that presses the cable center conductor (signal wire) SCa from the upper side is provided. In addition, a locking part (not shown in the FIGS) for locking with the insulating housing 11 is provided at a position facing the lower side sandwiching the recess provided on this upper-side beam part 12c and the cable center conductor SCa. Furthermore, the signal transmitting conductive terminal 12 extends from the locking part to the rearward side and is bent to the lower side, and extends again in the forward side about to the position of the locking part, and is bent to the lower side and extends to the elastic spring part 12b.

In addition, the upper-side beam part 12c of this cable sandwiching part 12a is configured to be a patulous state such as that shown in, for example, FIG. 8 and FIG. 9 in the initial state before connecting the terminal portion of the abovementioned thin coaxial cable SC. That is, the upper-side beam part 12c in the initial state has a shape standing up obliquely upward, and in the terminal portion of the thin coaxial cable SC is placed and set on the cable supporting part 14d as shown in FIG. 9, when the shell lid 14b of the shielded shell 14 is pushed down until a substantially horizontal state along with the insulation pressing board 11c, the upper-side beam part 12c of the cable sandwiching part 12a is configured to be pushed down until a substantially horizontal state by the insulation pressing board 11c, and to press the cable center conductor (signal wire) SCa from the upper side.

In addition, the elastic spring part 12b of the signal transmitting conductive terminal (signal contact) 12 is formed to extend from the abovementioned cable sandwiching part 12a to the rearward side in the inside of the insulating main body 11a and to bent to the lower side, and to extend again to the forward side, and to stand up again upward after once extending obliquely downward so as to form a cantilevered beam shape and overhanging in a curved shape to the lower side. Furthermore, at the lowest end top portion in the lower curved portion of this elastic spring part 12b, the contact part 12d coming in contact with the signal conductive path CPa provided in a portion between a pair of the aforementioned fit connecting hole MFa themselves is formed. This contact part 12d is configured to be pressed against the signal conductive path CPa by the elastic displacement action of the abovementioned elastic spring part 12b having a cantilevered beam shape.

In the outside of the both sides of such signal transmitting conductive terminal 12, as mentioned above, a pair of grounding conductive terminals (ground contact) 13, 13 are disposed, and the contact parts 13a, 13a provided in each of the grounding conductive terminals 13, 13 for the contact part 12d provided on the signal transmitting conductive terminal (signal contact) 12 are arranged in the both side portion of the rearward side area, and these contact parts 12d, 13a and 13a are in a rotationally asymmetric positional relationship within a plane perpendicular to the fitting direction.

With such configuration, in performing a fitting operation, when the plug connector 10 is erroneously arranged in the opposite side of the rotation direction, the fitting operation itself becomes possible, or even if the fitting is possible, there would be no electrical conduction, and thus the prevention of improper fitting can be achieved.

Furthermore, the contact part 12d of the abovementioned signal transmitting conductive terminal (signal contact) 12 and the contact part 13a of the grounding conductive terminal (ground contact) 13 of the shielded shell 14 are provided respectively on the leading end in the swinging side of the arm shaped members that form a cantilevered shape and extends in the oblique anteroposterior direction as mentioned above, and the extending directions of those arm shaped members, that is, the directions reaching from each swinging support point 12e,13b to each contact part 12d,13a is set to be the direction opposite to each other in the anteroposterior direction.

In such configuration, moment is generated centering around the contact parts 12d, 13a by the elastic displacement action of the both arm shaped members of a cantilevered beam shape, which constitute the signal transmitting conductive terminal (signal contact) 12 and the grounding conductive terminal (ground contact) 13, and both of those moments are in the direction opposite to each other, thereby canceling themselves. As a result, when operating a fitting and after the fitting, the plug connector 10 is maintained in a stable state.

In addition, the contact part 12d of these signal transmitting conductive terminals (signal contact) 12 is in a positional relationship for sandwiching the wall of the product case MF in the thickness direction between the engagement locking part 14j of sandwiching supporter 14h in the same manner as the contact part 13a of the abovementioned grounding conductive terminal (ground contact) 13, and the plug connector 10 is configured to be held on the wall of the product case MF in the upward and downward direction by the elastic displacement action of the cantilevered beam shaped member that constitutes the signal transmitting conductive terminal 12 and the grounding conductive terminal 13.

With such configuration, the whole body of the plug connector 10 inserted/fitted into the product case MF is held stably by the sandwiching force of the engagement locking part 14j of the sandwiching supporter 14h, the contact part 12d of the signal transmitting conductive terminal (signal contact) 12 and the contact part 13a of the grounding conductive terminal (ground contact) 13.

Moreover, in this embodiment, in the cross sectional direction (anteroposterior direction) in FIG. 14, the engagement locking part 14j is disposed between the contact part 12d of the signal transmitting conductive terminal 12 and the contact part 13a of the grounding conductive terminal 13, and thus even if a movement operation force is added in either direction of the forward and backward movement of the plug connector 10, the whole body of the plug connector 10 is stably supported centering the engagement locking part 14j, and the smooth movement of the plug connector 10 is performed.

[Sliding Friction Interference Preventing Structure]

Figure 3:
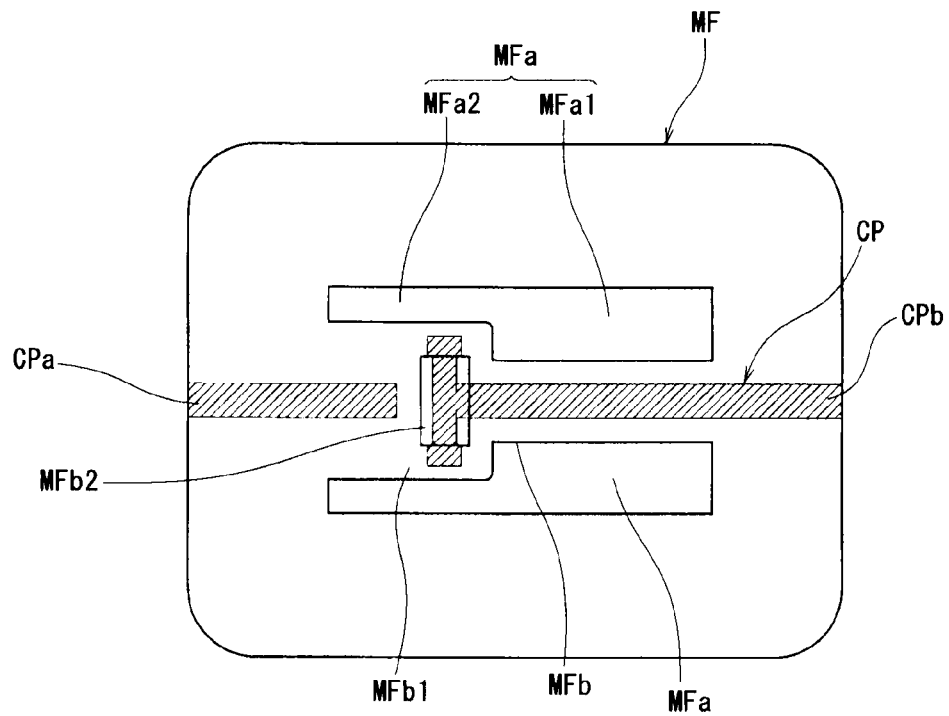
FIG. 3 is a plan view illustrating a configuration of the product case according to the first embodiment of the present invention shown in FIG. 1.
Figure 4:
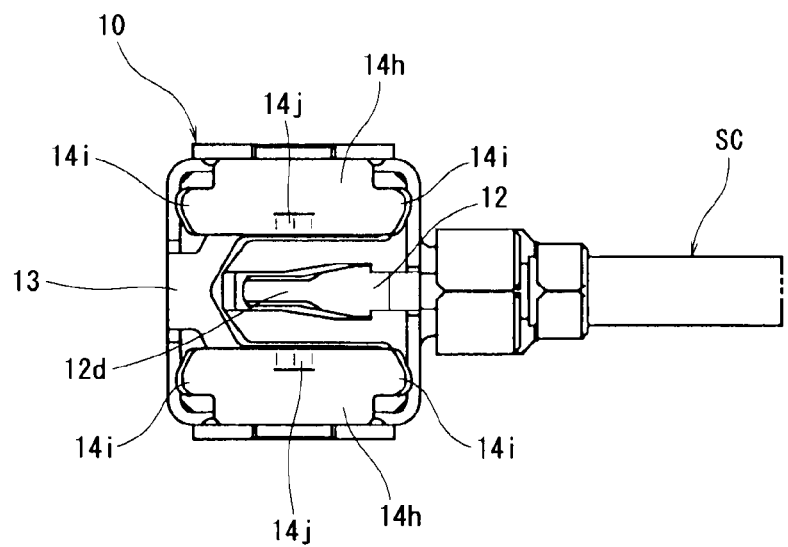
FIG. 4 is a bottom view illustrating the plug connector according to the first embodiment of the present invention shown in FIG. 1 to FIG. 3 when viewed from its lower side.

Meanwhile, in the inner side of the forward side fitting hole MFa2 provided on the product case MF in this embodiment, that is, on a surface exposed to the outer side of both front-back surfaces of the fixed main board MFb1 provided in the forward side of the abovementioned fit fixing part MFb, as shown mainly in FIG. 3 and FIG. 7, an interference preventing recess MFb2 which allows space from the connector main body 10A and maintains the connector main body 10A in a non-contact state when the connector main body 10A moves in the anteroposterior direction that is the extending direction of the fit fixing part MFb is provided. This interference preventing recess MFb2 is provided at a position corresponding to an area to the inner side in the anterior end portion of the ground conductive path CPb with which the contact parts 13a, 13a of the grounding conductive terminals (ground contact) 13, 13 come in contact in the fitting state of the abovementioned plug connector 10, and a portion between the contact positions themselves of the contact parts 13a, 13a of the both grounding conductive terminals 13, 13 is recessed and formed to form a planar substantially rectangular shape.

In addition, the length of the interference preventing recess MFb2, that is, the length of anteroposterior direction in the moving direction of the connector main body 10A, is larger than the length of the anterior end portion of the abovementioned ground conductive path CPb, and smaller than the whole length of the connector main body 10A.

Figure 5:
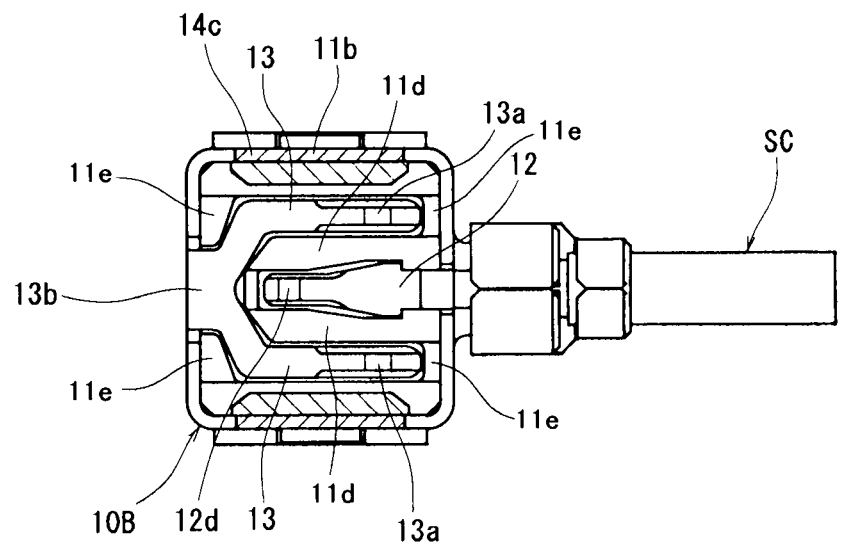
FIG. 5 is a view illustrating a horizontal cross section at an intermediate position in a direction toward the height of the plug connector shown in FIG. 4.

If such interference preventing recess MFb2 is provided, in the plug connector 10's fitting operation, when the connector main body 10A moves on the surface of the wall of the product case MF, an electrical loose connection due to sliding contact abrasion or the like is not generated. Specifically, as shown in FIG. 5 and FIG. 7, the bottom surface 11d of the insulating housing 11, which constitutes a part of the connector main body 10A of the plug connector 10 and the ground conductive path CPb formed on the product case MF are maintained in a non-contact state through the interference preventing recess MFb2, and the sliding contact abrasion of the bottom surface 11d of the insulating housing 11 is properly prevented, and therefore there would be no generation of electrical loose connection due to the sliding contact abrasion chip or the like of the connector main body 10A.

Furthermore, in this embodiment, the outer side bottom surface 11e which makes up a part of the bottom surface of the connector main body 10A is formed in a shape more recessed than the central side bottom surface 11d. More specifically, the outer side bottom surface 11e becomes, as mentioned above, when the connector main body 10A moves in the extending direction of the fit fixing part MFb, a portion not opposing to the interference preventing recess MFb2, and the outer side bottom surface 11e is more recessed than the central side bottom surface 11d, that is, a portion opposed to the interference preventing recess MFb2 when the connector main body 10A moves in the extending direction of the fit fixing part MFb, and thus is formed to form a step in the upward direction shown in FIG. By employing such configuration, when the connector main body 10A is moved, the non-contact state of the connector main body 10A against the anterior end portion of the ground conductive path CPb is more properly maintained.

Figure 16:
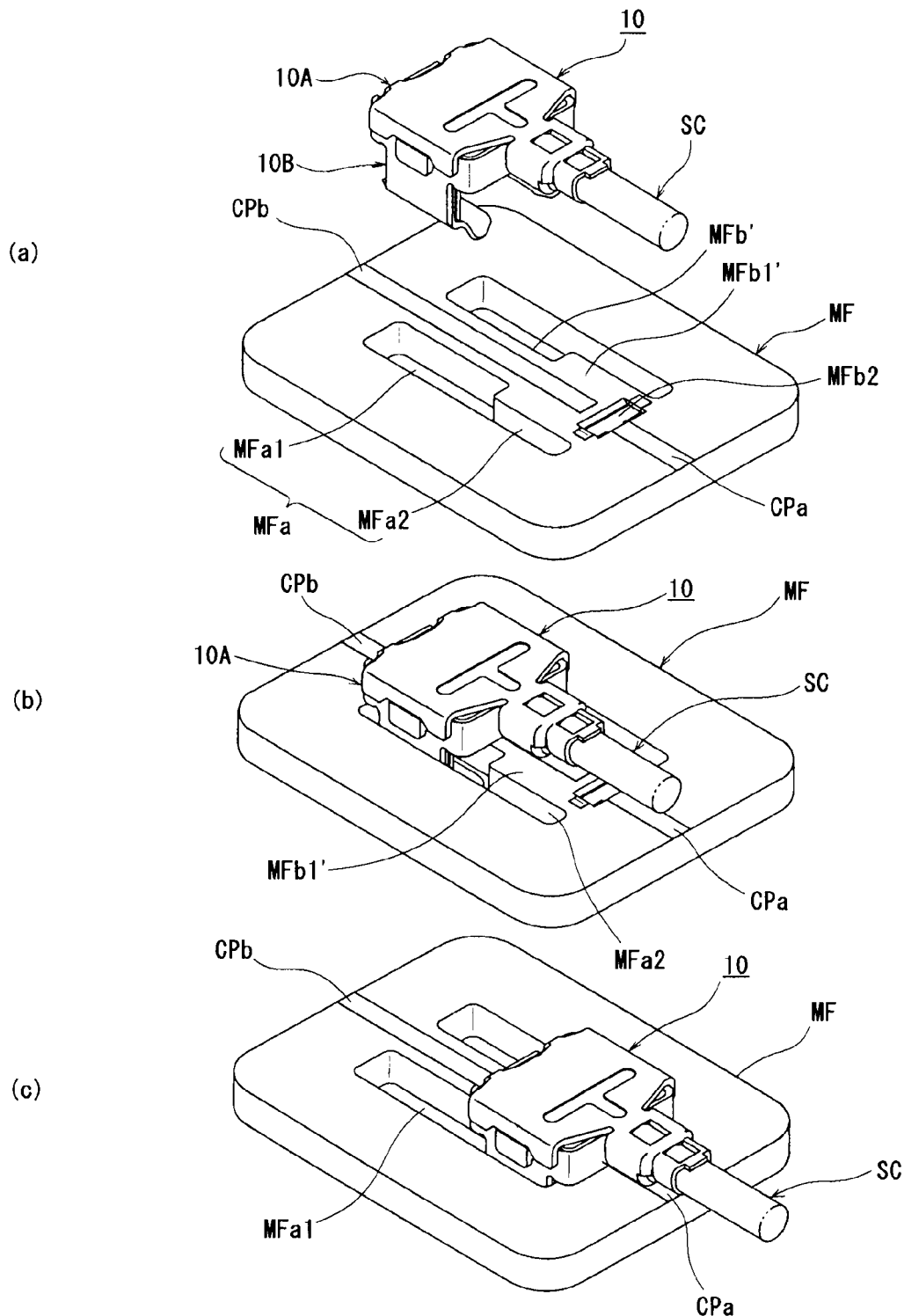
FIG. 16 shows the fit fixing part of the product case according to the second embodiment of the present invention, to which the plug connector according to the first embodiment of the present invention is applied, and (a) is an external perspective view showing the plug connector from the rearward side in a state before being fitted, (b) is an external perspective view showing state in which the plug connector is inserted into the fit connecting hole of the product case, and (c) is an external perspective view illustrating the fitting state in which the plug connector is moved further forward.

Meanwhile, the second embodiment according to FIG. 16 in which the same component member as in the abovementioned first embodiment is denoted by the same reference sign employs a configuration for bringing the connector main body 10A into a fitting state by moving the same toward the rearward side from the forward side that is the opposite side. That is, as mentioned above, the engagement locking part 14j provided in the plug connector 10 side has both in the front and in the rear inclined engaging surfaces approaching both of the extending directions of the fit fixing part MFb (anteroposterior direction), and is disposed at a substantially central portion in the longitudinal direction of the sandwiching supporter 14h that forms a part of the connected legs 14, and thus either direction of the extending direction of the fit fixing part MFb (anteroposterior direction) is also selectable for the moving direction of the connector main body 10A until the final securing is performed. Therefore, in this embodiment, the fixed main board MFb1' is disposed in the rearward side of the fit fixing part MFb', and the connector main body 10A is moved to the rearward side, thereby configuring the same to be fixed to the fixed main board MFb1'. In such embodiment, the action/effect almost the same as the abovementioned embodiment can be obtained as well.

Figure 17:
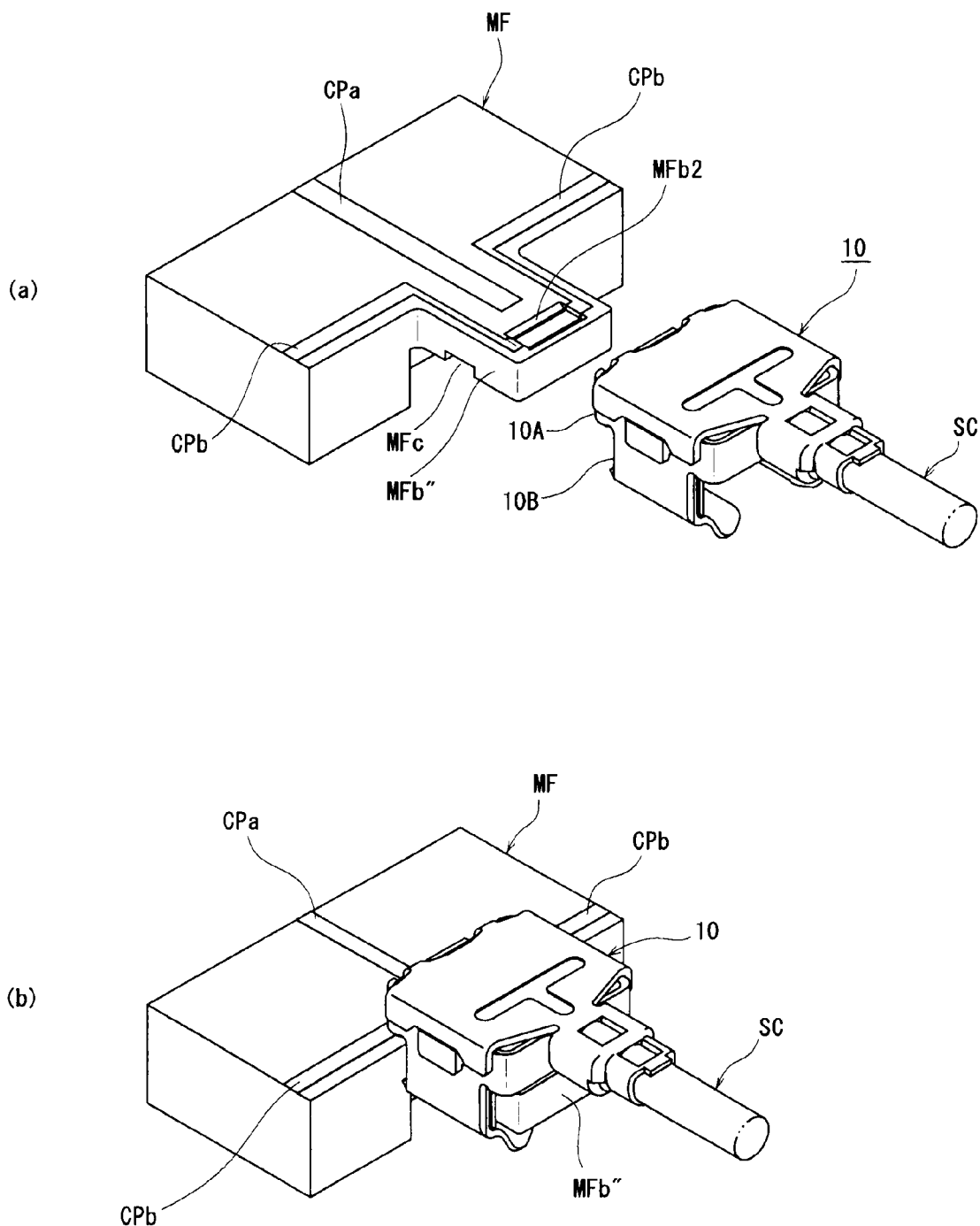
FIG. 17 shows the fit fixing part of the product case according to the third embodiment of the present invention, to which the plug connector according to the first embodiment is applied, and (a) is an external perspective view showing the plug connector from the rearward side in a state before being fitted, and (b) is an external perspective view illustrating a fitting state in which the plug connector is fitted over the fit fixing part of the product case and moved forward.

Furthermore, in the third embodiment according to FIG. 17 in which the same component member as in the abovementioned first embodiment is denoted by the same reference sign, the fit fixing part MFb" in which a part of the wall of the product case MF is protruded from the end edge portion of the wall of the product case MF in a cantilevered shape is provided. The fit fixing part MFb" in this third embodiment corresponds to the fixed main board MFb1 in the abovementioned first embodiment, which constitutes the forward side portion of the fit fixing part MFb, and the connector main body 10A of the plug connector 10 is moved forward from the state being arranged to face the rearward side of fit fixing part MFb" as shown in FIG. 17(a), and thus the connector main body 10A is configured to be fitted over the fit fixing part MFb" and brought into the final fitting state as shown in FIG. 17(b). In such embodiment, the action/effect almost the same as the abovementioned embodiment can be obtained as well. In addition, with regard to the third embodiment, the final fitting state is brought by having the protruded end edge portion of the fit fixing part MFb" as the back end edge portion of the connector main body 10, and the back-to-front direction is possible by applying the wiring pattern conductive path CP.

Figure 18:
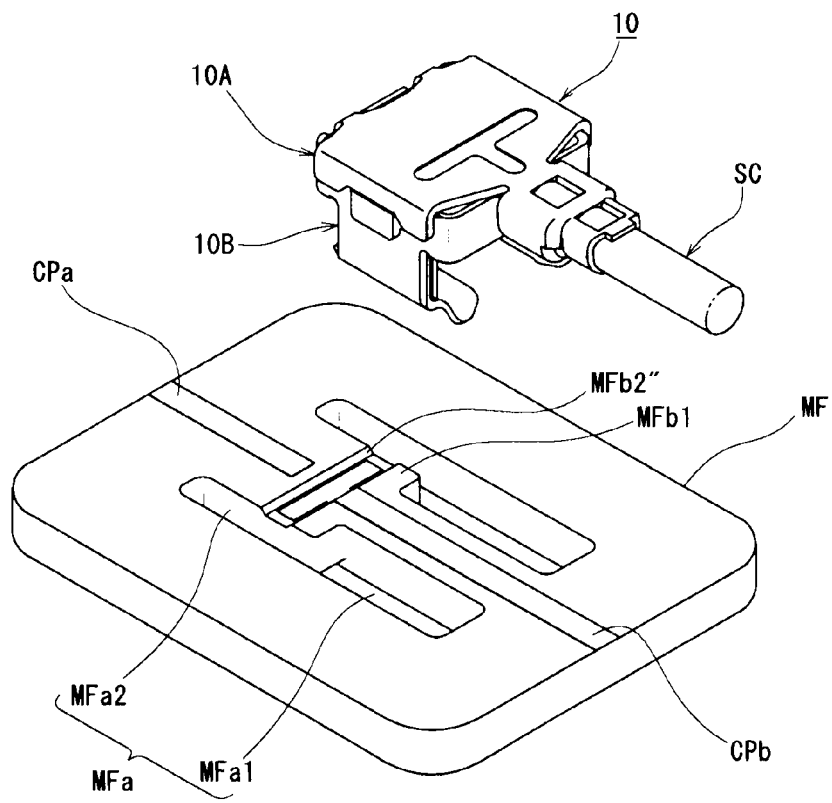
FIG. 18 shows the fit fixing part of the product case according to the fourth embodiment of the present invention, to which the plug connector according to the first embodiment is applied, and is an external perspective view illustrating the plug connector from the rearward side in a state before being fitted.
Figure 19:
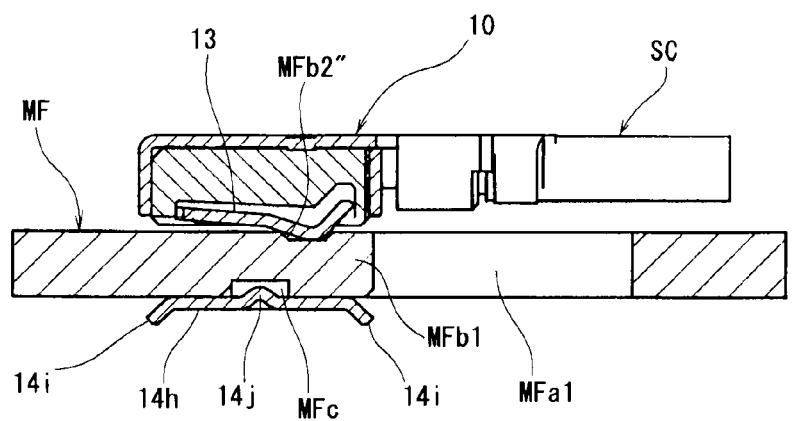
FIG. 19 is a longitudinal sectional view corresponding to FIG. 14(*d*) that shows a state in which the plug connector in the initial inserted state shown in FIG. 18 is moved forward to the fitting state and the wall of the product case is sandwiched between a connected leg and a conductive contact.
Figure 20:
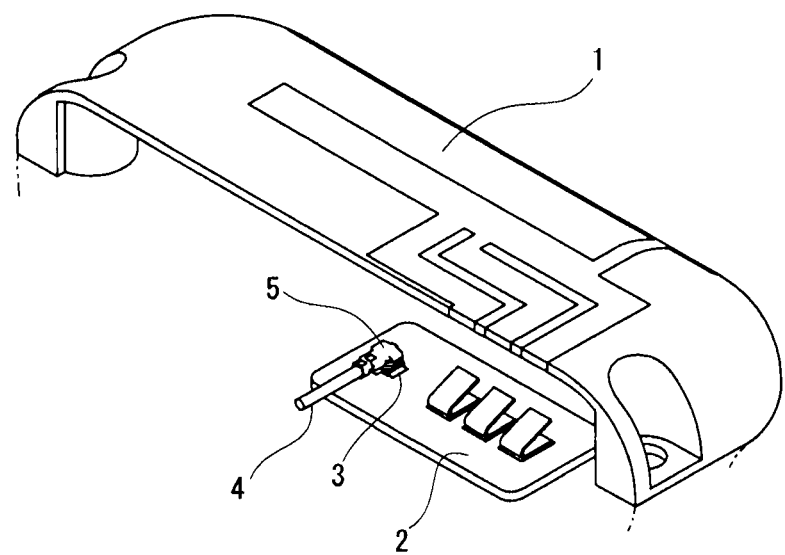
FIG. 20 is an external perspective view illustrating a connection state by a commonly used general electrical connector.

Moreover, in the fourth embodiment according to FIG. 18 and FIG. 19 in which the same component member as in the abovementioned first embodiment is denoted by the same reference sign, the interference preventing recess MFb2" provided on the fixed main board MFb1 of the fit fixing part MFb is formed to form a groove shape over the overall length of the fit fixing part MFb. The anterior end portion of the ground conductive path CPb is formed to form a planar shape in the bottom part of the interference preventing recess MFb2" having the groove shape, and the contact parts 13a, 13a of the grounding conductive terminals (ground contact) 13, 13 are connected to the right and left both end portion at the front end of the ground conductive path CPb having a planer shape.

According to the fourth embodiment having such configuration, when the plug connector 10 is fitted, the contact part 13a of the grounding conductive terminal (ground contact) 13 is in a state engaged with the interference preventing recess MFd' and a lock function is obtained, by just that much, the configuration of the lock mechanism of the plug connector 10 is simplified, and the local concentration of the fitting force is relieved, and thus the endurance especially in repeated attaching/detaching is improved.

While the invention made by the present inventor has been specifically described above, the present embodiment is not limited to the abovementioned embodiment, and it goes without saying that various variations can be made without departing from the scope thereof.

For example, in the abovementioned embodiment, the engagement locking part 14j in the plug connector 10 side is formed in a convex shape, and the lock locking part MFc in the product case MF side is formed in a concave shape; however, the concavo-convex relationship may be reversed.

Furthermore, in the abovementioned embodiment, the signal transmitting wiring pattern conductive path (signal conductive path) CPa is provided only on the outside surface that is one of the front-back both surfaces of the product case MF; however, may be provided on at least one of the surfaces, such as on the inside surface of the front-back both surfaces of the product case MF, or on both of the outside surface and the inside surface, and the wiring pattern conductive path CP can be disposed at an arbitrary position as appropriate. In the abovementioned embodiment, the terminal portion of the wiring pattern conductive path CP is arranged to extend in the anteroposterior direction; however, the ground conductive path CPb may be provided in the both sides sandwiching the signal conductive path CPa, and both of them may be arranged to extend to the forward side.

In addition, in the abovementioned embodiment, the fit connecting hole MFa formed on the wall of the surface of the product case MF is formed to form an opening having a planar substantially rectangular shape; however, may be formed to form various shapes such as a planar substantially circular-shaped round hole, and may be configured so as to be a hole not penetrating through the wall of the product case MF.

Moreover, the abovementioned embodiment is such that the present invention is applied to an electrical connector of a vertically inserting/horizontally fitting type; is also similarly applicable to an electrical connector of a horizontally inserting/vertically fitting type.

In addition, the present invention is not limited to the connector for stand-alone thin coaxial cable as the abovementioned embodiment, and also similarly applicable to an connector for a thin coaxial cable arranged in a multipolar shape, an electrical connector of a type in which multiple thin coaxial cables and insulated cables are mixed, or an electrical connector by which a flexible wiring substrate or the like is connected.

As stated above, this embodiment is applicable widely to a wide variety of electrical connectors which are used in various electric devices.

What is claimed is:

1. An electrical connector having a connector main body to be connected with a terminal portion of a signal transmitting medium, being configured in such a manner that, through the connector main body thereof, a signal transmitting medium is electrically connected to a conductive path provided on the wall of a product case which constitutes an electronic device having an predetermined electronic circuit, the electrical connector is configured in such a manner that a conductive contact that comes in contact with the conductive path of the product case and a pair of connected legs that protrude from the connector main body so as to face each other are provided in the connector main body, a fit fixing part formed in a beam shape extending so as to be arranged in a portion between the pair of connected legs themselves is provided in the product case, wherein a sandwiching supporter that reciprocatably comes in contact along with the surface of the fit fixing part of the product case and sandwiches the fit fixing part of the product case in the thickness direction between the conductive contact and the connected legs is provided in the connected legs, an engagement locking part that protrudes in the thickness direction of the product case and has an inclined engaging surface approaching both of extending directions of the fit fixing part is provided in the sandwiching supporter of the connected leg, and when the connector main body moves in either one of the extending directions of the fit fixing part, the engagement locking part is fitted to the product case side through the inclined engaging surface and brings the connector main body into a locked state in the extending directions of the fit fixing part.

2. The electrical connector according to claim 1, wherein a lock locking part to which the engagement locking part can be fitted is provided in the fit fixing part of the product case.

3. The electrical connector according to claim 1, wherein the fit fixing part of the product case has a both side edge portion in a board width direction that is perpendicular to an extending direction of said fit fixing part, and the both side edge portion of the fit fixing part is formed by an edge portion that defines a long hole formed penetrating through the wall of the product case.

4. The electrical connector according to claim 1, wherein the fit fixing part is configured by a member in which a part of the wall of the product case is protruded in a cantilevered shape.

5. The electrical connector according to claim 1, wherein the engagement locking part is formed by a dimple that has been processed to form a protruding shape as a part of the sandwiching supporter, and the engagement locking part comprising said dimple is disposed at a substantially central portion in the extending direction of the sandwiching supporter.

6. The electrical connector according to claim 1, wherein an interference preventing recess which allows space from the connector main body and maintains the connector main body in a non-contact state when the connector main body moves in the extending directions of the fit fixing part in the fit fixing part of the product case.

7. The electrical connector according to claim 6, wherein the interference preventing recess is formed so as to be larger than a length in a moving direction of the connector main body in the conductive path with which a contact part of the conductive contact comes in contact, and smaller than the whole length of the connector main body.

8. The electrical connector according to claim 6, wherein a bottom surface of the connector main body, which is arranged so as to face the surface of the product case, is such that when the connector main body moves in the extending directions of the fit fixing part, a portion not opposing to the interference preventing recess is formed in a shape more recessed than a portion opposing to the interference preventing recess.

9. The electrical connector according to claim 6, wherein, in the bottom surface of the interference preventing recess, a contact part of the conductive path is provided, and a contact part of the conductive contact is arranged so as to come in contact with a contact part of the interference preventing recess.

10. An electrical connector assembly provided with, a product case which constitutes an electronic device having an predetermined electronic circuit, and in which a signal transmitting conductive path is formed, and the electrical connector according to any one of claim 1 to claim 9.

* * * * *